(12) United States Patent
Mei et al.

(10) Patent No.: US 8,980,690 B1
(45) Date of Patent: Mar. 17, 2015

(54) LEAD FRAME BASED SEMICONDUCTOR DEVICE WITH ROUTING SUBSTRATE

(71) Applicants: Penglin Mei, Tianjin (CN); You Ge, Tianjin (CN); Meng Kong Lye, Shah Alam (MY)

(72) Inventors: Penglin Mei, Tianjin (CN); You Ge, Tianjin (CN); Meng Kong Lye, Shah Alam (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/462,565

(22) Filed: Aug. 19, 2014

(30) Foreign Application Priority Data

Nov. 8, 2013 (CN) .......................... 2013 1 0551693

(51) Int. Cl.
*H01L 21/44* (2006.01)
*H01L 23/495* (2006.01)

(52) U.S. Cl.
CPC .... *H01L 23/49503* (2013.01); *H01L 23/49541* (2013.01); *H01L 23/49575* (2013.01)
USPC .......................................... 438/106; 257/666

(58) Field of Classification Search
CPC ........... H01L 2924/01079; H01L 2924/01078; H01L 2924/01029; H01L 23/5226; H01L 23/481; H01L 23/4334; H01L 2224/48247; H01L 2224/48091; H01L 21/565
USPC ......... 257/666–668, 777, 778–779, 780–781, 257/784, 786, 787–788; 438/106–107, 109, 438/110, 123
See application file for complete search history.

(56) References Cited

U.S. PATENT DOCUMENTS

| | | | |
|---|---|---|---|
| 5,283,717 A | 2/1994 | Hundt | |
| 5,789,816 A | 8/1998 | Wu | |
| 6,159,765 A | 12/2000 | Charles et al. | |
| 7,148,567 B2 | 12/2006 | Moriguchi | |
| 7,825,526 B2 | 11/2010 | Dirks | |
| 7,911,053 B2 | 3/2011 | Liu | |
| 7,982,293 B2 | 7/2011 | Chan | |
| 8,222,719 B2 | 7/2012 | Golick | |
| 2008/0054432 A1* | 3/2008 | Corisis et al. | 257/686 |
| 2012/0257358 A1 | 10/2012 | Champion | |
| 2013/0093070 A1* | 4/2013 | Fukuda | 257/666 |
| 2014/0001611 A1* | 1/2014 | Jo et al. | 257/666 |

* cited by examiner

*Primary Examiner* — Hoa B Trinh
(74) *Attorney, Agent, or Firm* — Charles Bergere

(57) ABSTRACT

A semiconductor device including a lead frame, a routing substrate disposed within the lead frame, and an active component mounted on the routing substrate. The active component has a plurality of die pads. The routing substrate includes a set of first bond pads, a set of second bond pads, and interconnections, where each interconnection provides an electrical connection between a first bond pad and a corresponding second bond pad. The semiconductor device further includes electrical couplings between one or more of die pads of the active component and corresponding first bond pads of the routing substrate, as well as electrical couplings between leads of the lead frame and respective second bond pads of the routing substrate.

20 Claims, 4 Drawing Sheets

LEAD FRAME BASED SEMICONDUCTOR DEVICE WITH ROUTING SUBSTRATE

BACKGROUND OF THE INVENTION

The present invention relates generally to semiconductor device packages and, more particularly, to quad flat no lead (QFN) packages, power QFN (PQFN) packages, and the like.

Certain semiconductor packages, such as Quad Flat No-lead (QFN) and power QFN (PQFN) packages, include an integrated circuit (IC) die or other active component physically attached to a lead frame and electrically connected to the lead frame with a bond wires that span die pads on the die to respective leads of the lead frame. The IC die, the bond wires, and an interior portion of the lead frame are encapsulated by a mold compound, leaving a portion of the leads on the surface of the package exposed. These exposed leads serve as input and output (I/O) connections to the encapsulated IC die and are typically located along a periphery of the QFN package. Compared to other types of semiconductor packages, QFN packages advantageously provide shorter electrical paths and faster signal communication rates and are therefore widely used for power elements and other IC dies.

In a typical QFN package, a square IC die having die pads on all four sides, where the die pads are arranged in a square, is disposed centrally within a square lead frame that has leads on all four sides, where the leads are also arranged in a square. This configuration makes routing of bond wires straightforward because the bond wires are disposed substantially radially and can be spaced sufficiently so as not to interfere with one another.

However, a conventional QFN package that has leads on all four sides is not flexible enough to accommodate IC dies having other configurations, such as an elongated rectangular IC die having die pads on only two sides, where the die pads are arranged in two parallel rows along the longer edges of the IC die. If bond wire connections were attempted between these two parallel rows of die pads on the IC die and the square arrangement of leads disposed around the surrounding lead frame, then a number of the bond wires would not be able to be routed and still be spaced sufficiently apart. In particular, the bond wires connecting the die pads disposed near the corners of the IC die will likely either touch one another or be disposed so closely as to risk interference with one another.

Other IC dies may have die pad configurations that create similar problems for routing bond wires, such as a square IC die having a first set of die pads arranged in a square around its periphery and a second set of die pads arranged in a smaller square disposed within the first set of die pads.

Accordingly, it would be advantageous to have a QFN package that can accommodate IC dies having different or non-conventional die-pad configurations.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Figure 1:
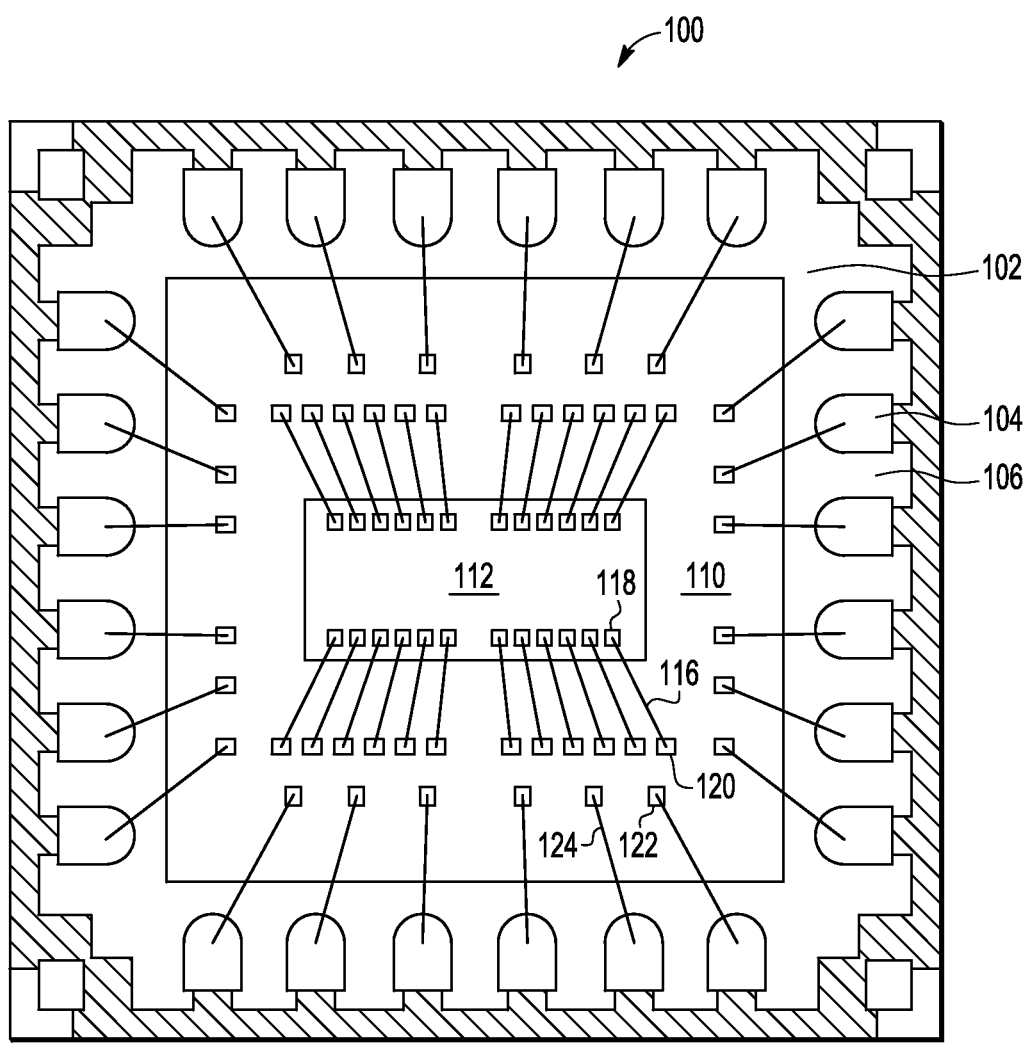
FIG. 1 shows a top X-ray view of a packaged quad flat no-lead (QFN) type semiconductor device in accordance with one embodiment of the invention.

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

One embodiment of the invention is a semiconductor device, and another embodiment is a method for assembling a semiconductor device.

In one embodiment, a semiconductor device includes a lead frame having a plurality of leads, a routing substrate disposed within the lead frame, and an active component (semiconductor die) mounted on the routing substrate. The active component has a plurality of die pads. The routing substrate includes a set of first bond pads, a set of second bond pads, and a plurality of interconnections, where each interconnection provides an electrical connection between a first bond pad and a corresponding second bond pad. The semiconductor device further includes electrical couplings (e.g., bond wires) between one or more of the die pads of the active component and corresponding first bond pads of the routing substrate, as well as electrical couplings between each of a plurality of leads of the lead frame and respective second bond pads of the routing substrate.

In another embodiment, a method for assembling a semiconductor device includes: (a) mounting, on a routing substrate, an active component (i.e., a semiconductor die) having a plurality of die pads, wherein the routing substrate comprises a set of first bond pads, a set of second bond pads, and a plurality of interconnections, each interconnection providing an electrical connection between a first bond pad and a corresponding second bond pad; (b) disposing the active component and routing substrate within a lead frame comprising a plurality of leads; (c) electrically coupling one or more die pads of the active component to corresponding first bond pads of the routing substrate; and (d) electrically coupling one or more leads of the lead frame to corresponding second bond pads of the routing substrate.

Figure 2:
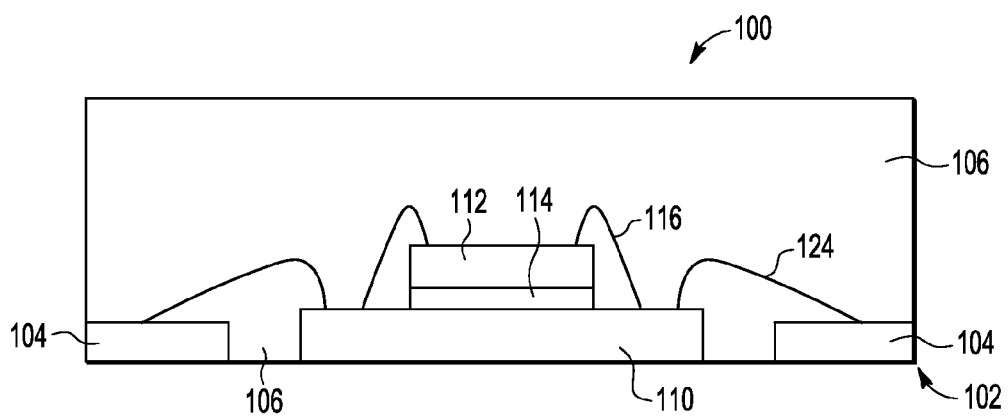
FIG. 2 shows a side X-ray view of the semiconductor device of FIG. 1.

FIG. 1 shows a top X-ray view of a packaged quad flat no-lead (QFN) type semiconductor device 100 consistent with one embodiment of the invention, and FIG. 2 shows a side cross-sectional view of semiconductor device 100 of FIG. 1. It is noted that alternative embodiments are not limited to QFN packages, but can be implemented for other package types, such as (without limitation), power QFN (PQFN) packages, and quad flat pack (QFP) or other leaded packages.

The semiconductor device 100 comprises a lead frame 102 having multiple metal leads 104 separated by and embedded within an electrically-insulating molding compound 106. The leads 104 are electrically connected to bond pads on an IC die 112 and/or to external electrical components to allow the IC die 112 to operate with those external components. The leads 104 may be formed of copper, an alloy of copper, a copper plated iron/nickel alloy, plated aluminum, or the like. Often, copper leads are pre-plated first with a nickel base layer, then a palladium mid layer, and finally with a very thin, gold upper layer. The molding compound 106 may be an epoxy or other suitable material.

The lead frame 102 functions as a base onto which other elements of the semiconductor device 100 are mounted. In particular, a routing substrate 110 (e.g., similar to a flag or die pad) is mounted and disposed within a bottom surface of the lead frame 102. The routing substrate 110 is adapted to receive an IC die 112 (or other active component) that is mounted in a central region thereof. As explained in more detail below, the routing substrate 110 is disposed centrally in an opening in the lead frame, such as where a lead frame die pad or flag typically is located. The routing substrate 110 may be held in place with a tape temporarily attached to the lead frame. The routing substrate 110 may comprise a layer of insulative material with embedded metal lines or interconnects, like a single metal layer printed circuit board. The IC die 112 is a well-known component of semiconductor devices, and thus, a detailed description thereof is not necessary for a complete understanding of the invention.

The IC die 112 is disposed on the routing substrate 110 with a die-attach layer 114, which may include an epoxy compound, electrically-insulating die-attach adhesive, die-attach tape, solder, or the like.

As shown in FIG. 1, the routing substrate 110 has two sets of wire bond pads: (i) a set of inner wire bond pads 120 arranged in two parallel rows and (ii) a set of outer wire bond pads 122 arranged in a square surrounding the inner wire bond pads 120. One or more wire bond pads 118 on the IC die 112 are electrically connected to one or more inner wire bond pads 120 of the routing substrate 110 with first bond wires 116. One or more of the leads 104 of the lead frame 102 are electrically connected to one or more outer wire bond pads 122 of the routing substrate 110 with second bond wires 124. The first and second bond wires 116 and 124 are formed from a conductive material such as aluminum, silver, gold, or copper, and may be either coated or uncoated.

Figure 3:
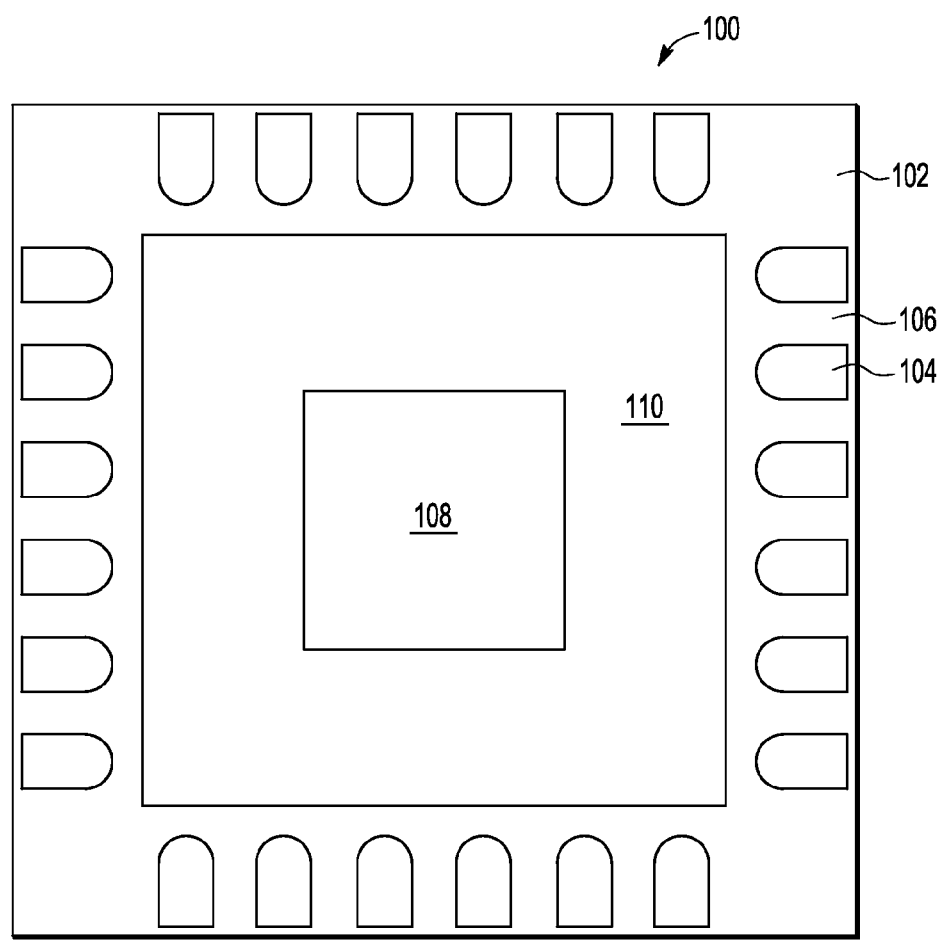
FIG. 3 shows a view of the bottom surface of the semiconductor device of FIG. 1.

FIG. 3 shows a view of the bottom surface of the semiconductor device 100. As shown, the routing substrate 110 is located centrally within the leads 104 of the lead frame 102 and disposed at the bottom of the semiconductor device 100 such that a surface of the routing substrate 110 is exposed. That is, the routing substrate 110 is located where a lead frame die pad or flag typically is located and may have an exposed bottom surface.

Figure 4:
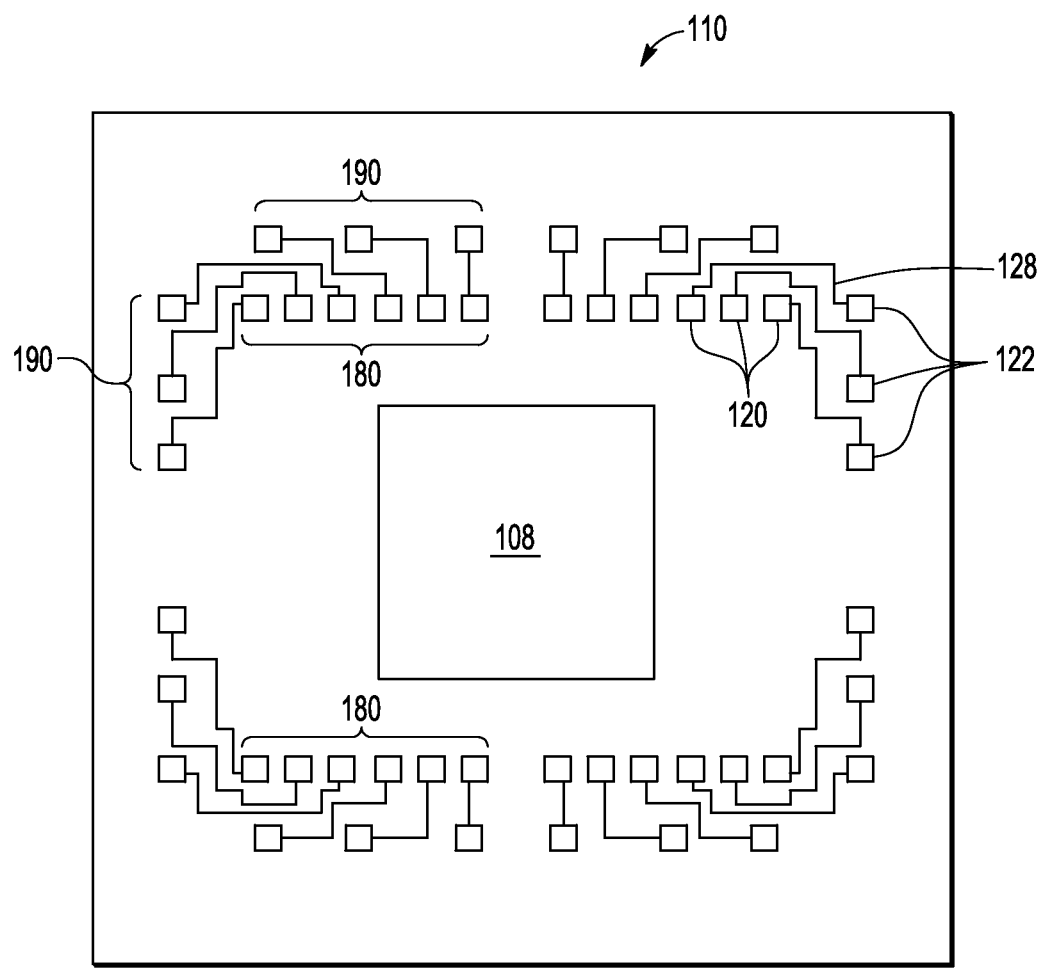
FIG. 4 shows a plan X-ray view of the routing substrate of the semiconductor device of FIG. 1.

FIG. 4 shows a plan X-ray view of the routing substrate 110, including the inner and outer wire bond pads 120 and 122. As shown, each of the inner wire bond pads 120 is electrically coupled to a respective one of the outer wire bond pads 122 with an interconnection 128 within the routing substrate 110. The interconnections 128 may be formed as any type of electrical connections embedded within and/or disposed on the routing substrate 110, such as printed circuit board (PCB) connections, traces, metal vias, or the like. Routing for these electrical connections 128 is desirably performed using rules such as PCB layout guidelines for ball grid arrays (BGAs), or rules for other fine-pitch and/or high pin-count trace-routing scenarios.

In one embodiment, the routing substrate 110 further includes an exposed die pad 108 disposed centrally within the inner wire bond pads 120. The exposed die pad 108 provides a heat-removal path and further serves as a ground connection to a circuit board to which the semiconductor device 100 is physically and electrically coupled. In alternative embodiments, one or more exposed die pads 108 may be disposed in locations other than centrally within the routing substrate 110, and those one or more exposed die pads 108 may have shapes other than square shapes.

The IC die 112, first and second bond wires 116 and 124, and an upper portion of the lead frame 102 are all encapsulated in a suitable molding compound 106 (best seen in FIG. 2), to protect the die 112 and bond wires 116, 124 from the environment. The molding compound 106 may be a plastic, an epoxy, a silica-filled resin, a ceramic, a halide-free material, the like, or combinations thereof, as is known in the art.

The electrical connections from the IC die 112 to the lead frame 102 comprise three steps, namely, a first step from a wire bond pad 118 on the IC die 112 to a corresponding inner wire bond pad 120 of the routing substrate 110 with a corresponding first bond wire 116, a second step from that inner wire bond pad 120 to a corresponding outer wire bond pad 122 of the routing substrate 110 by way of a corresponding interconnection 128 of the routing substrate 110, and a third step from that outer wire bond pad 122 to a corresponding lead 104 of the lead frame 102 with a corresponding second bond wire 124. Routing each of these connections in three steps can be used to improve spacing between bond wires and eliminate the problem of adjacent or nearby bond wires interfering with one another, which would otherwise occur when certain IC-die types (such as the elongated rectangular die shown in FIG. 1) or configurations are used.

It should be understood that, in alternative embodiments of the invention, only some electrical connections between the IC die and lead frame are made via interconnections 128 in the routing substrate, while other electrical connections are made directly between the IC die and lead frame with individual bond wires.

Figure 5:
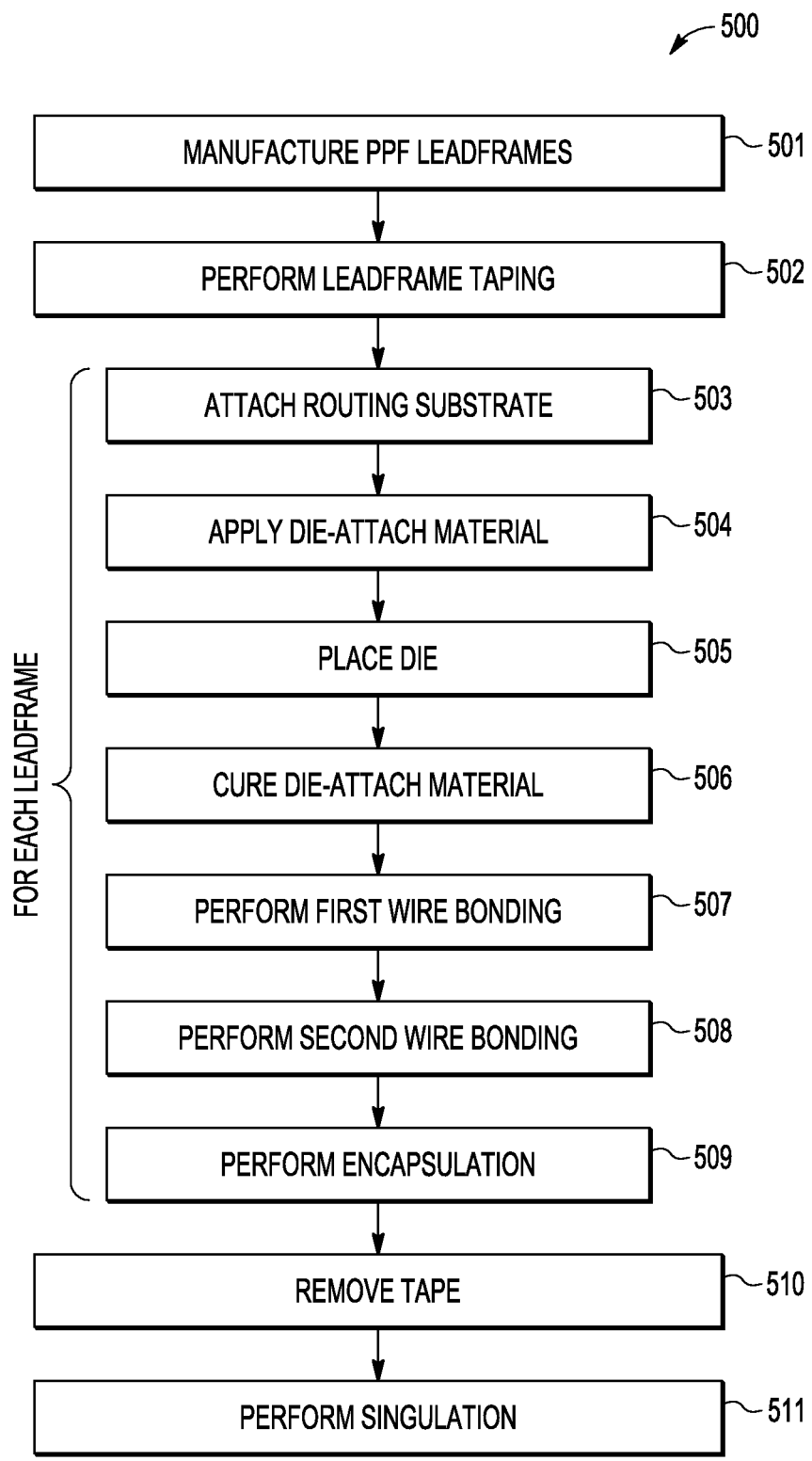
FIG. 5 is a flow chart of a process for assembling the semiconductor device of FIG. 1.

FIG. 5 is a flow chart showing an example of a process 500 for assembling a semiconductor device consistent with various embodiments of the present invention, such as the semiconductor device 100, though it should be appreciated that there are many other variations.

It should be understood that, although not explicitly depicted in the drawings, in real-world manufacturing, a two-dimensional array of different instances of the semiconductor device 100 is assembled on a multi-device lead frame that has a two-dimensional array of different instances of the lead frame structure of FIG. 1. After assembly, the multiple semiconductor devices 100 are then separated, e.g., in a singulation process involving a saw or laser, to form individual instances of the semiconductor device 100.

As shown in FIG. 5, the assembly process begins at step 501, where a two-dimensional array of pre-plated lead frames 102 is either manufactured or provided to an assembly house, with each instance of the lead frame 102 being formed with a plurality of leads 104.

At step 502, lead frame taping is performed, where tape is attached to the bottom of the array of lead frames 102. The tape is used to provide support for the routing substrate 110.

The following steps 503 through 509 are then performed for each instance of the lead frame 102 in the array:

At step 503, the routing substrate 110 is attached to the lead frame tape.

At step 504, the die-attach layer 114 is applied to the routing substrate 110.

At step 505, an individual IC die 112 is placed on the die-attach layer 114, e.g., using conventional pick-and-place machinery.

At step 506, the die-attach layer 114 is cured.

At step 507, the first bond wires 116 are wire bonded from the wire bond pads 118 of the IC die 112 to corresponding inner wire bond pads 120 of the routing substrate 110.

At step 508, the second bond wires 124 are wire bonded from the outer wire bond pads 122 of the routing substrate 110 to corresponding leads 104 of the lead frame 102.

At step 509, encapsulation is performed by application of the molding compound 106. One way of applying the molding compound is using a mold insert of a conventional injection-molding machine, as is known in the art. The molding material is typically applied as a liquid polymer, which is then heated to form a solid by curing in a UV or ambient atmosphere. The molding material can also be a solid that is heated to form a liquid for application and then cooled to form a solid mold. Subsequently, an oven is used to cure the molding material to complete the cross-linking of the polymer. In alternative embodiments, other encapsulating processes may be used.

At step 510, the tape is removed.

At step 511, the packaged lead frames are then singulated into individual packages to create individual instances of the semiconductor device 100.

At that point, the semiconductor device 100 can be attached to a PCB or other device using a soldering process via the exposed portions of leads 104 disposed on the bottom surface of semiconductor device 100.

In the embodiment shown in FIGS. 1-4 and discussed above, a rectangular die having two parallel, opposing rows of die pads is mounted within a square lead frame having four rows of leads, i.e., one row along each edge of the lead frame. It can be seen that the use of the substrate 110 permits a configuration whereby the arrangement of the inner wire bond pads 120 is dependent on the arrangement of the bond pads 118 of the IC die 112 and is independent of the arrangement of the leads 104 of the lead frame 102. In other words, the pattern defined by the inner wire bond pads 120 (which could be defined, e.g., as either an elongated rectangular pattern or simply as two parallel lines) is similar to a pattern defined by the bond pads 118 of the IC die 112 (which could be defined, e.g., as either an elongated rectangular pattern or simply as two parallel lines) and is dissimilar from a pattern defined by the leads 104 of the lead frame 102 (which could be defined, e.g., as a square pattern).

Similarly, the arrangement of the outer wire bond pads 122 is dependent on the arrangement of the leads 104 of lead frame 102 and is independent of the arrangement of the bond pads 118 of the IC die 112. In other words, the pattern defined by the outer wire bond pads 122 (which could be defined, e.g., as a square pattern) is similar to a pattern defined by the leads 104 of the lead frame 102 (which could be defined, e.g., as a square pattern) and is dissimilar from a pattern defined by the bond pads 118 of the IC die 112 (which could be defined, e.g., as either an elongated rectangular pattern or simply as two parallel lines).

It should be understood that other embodiments are possible wherein the arrangement of inner bond pads is dependent on the arrangement of the die pads on the active component and independent of the arrangement of the leads on the lead frame, and the arrangement of the outer bond pads is dependent on the arrangement of the leads on the lead frame and independent of the arrangement of the die pads on the active component. In some embodiments, a pattern defined by the inner bond pads is similar to a pattern defined by the die pads on the active component and dissimilar from a pattern defined by the arrangement of the leads on the lead frame, and a pattern defined by the outer bond pads is similar to a pattern defined by the arrangement of the leads on the lead frame and dissimilar from a pattern defined by the die pads on the active component.

In one embodiment, the die pads on the active component are arranged in two parallel rows along opposing edges of the active component, the lead frame is a square lead frame having four sides, with the leads of the lead frame arranged in four rows, each row disposed along one of the four sides of the lead frame, the inner bond pads are arranged in a square formation, and the inner bond pads are arranged in two parallel rows, within the square formed by the second bond pads.

In some embodiments, the outer set of bond pads defines a polyhedron, such as a square or a rectangle, within which all of the bond pads of the inner set of bond pads are disposed, e.g., as shown in FIG. 4.

In some embodiments, the average distance between bond pads in the inner set of bond pads is less than the average distance between bond pads in the outer set of bond pads, e.g., as shown in FIG. 4.

The inner and outer sets of bond pads may comprise subsets or subgroupings of similarly-spaced bond pads. For example, in FIG. 4, the inner wire bond pads 120 are arranged in four sub-groupings 180 within which each of the inner wire bond pads 120 are spaced approximately the same distance apart, and the outer wire bond pads 122 are arranged in eight sub-groupings 190 within which each of the outer wire bond pads 122 are spaced approximately the same distance apart.

In any event, by using one or more of the foregoing techniques, the bond pads on routing substrate 110 are desirably spaced so that interference is avoided between nearby or adjacent bond wires.

Although embodiments of the invention are described herein as including only a single IC die disposed within a lead frame, in alternative embodiments, multiple IC dies are disposed within a single lead frame, wherein at least some of the electrical connections between one or more of the IC dies and the lead frame pass through interconnections in a routing substrate.

Although embodiments of the invention are described herein as involving two physical bonding-wire segments to form a single electrical connection between an IC die and a lead frame, it should be understood that more than two physical bonding-wire segments can be used to form a single electrical connection between an IC die and a lead frame via one or more routing substrates, in alternative embodiments of the invention.

Although embodiments of the invention are described herein as involving lead frames that are not premolded, it should be understood that alternative embodiments are possible in which pre-molded lead frames are used.

It should be understood that the invention is not limited to IC dies disposed within a lead frame and can be used with other active components disposed within a lead frame as well. Accordingly, the term "active component" should be understood as including any type of circuitry that performs any suitable type of function.

Although embodiments of the invention are described with respect to a quad flat no lead (QFN) package, the teachings described herein can be used to fabricate power quad flat no lead (PQFN) packages, dual flat no lead packages (DFN), and other types of packages on two or more physical bonding-wire segments form a single electrical interconnection between an IC die and a lead frame via a routing substrate.

Although embodiments of the invention are described herein employing pre-plated lead frames, it should be understood that other types of lead frames may be used in other embodiments of the invention.

By now it should be appreciated that there has been provided an improved packaged semiconductor device and a method of forming the improved packaged semiconductor device. Circuit details are not disclosed because knowledge thereof is not required for a complete understanding of the invention.

Although the invention has been described using relative terms such as "front," "back," "top," "bottom," "over," "above," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

As used herein, the term "mount," as in "an active component mounted on a substrate" or a step of "mounting an active component on a substrate," covers situations in which the active component is mounted directly onto the substrate with no other intervening components or structures, as well as situations in which the active component is directly mounted to one or more other components and/or structures, which are, in turn, directly mounted to the substrate.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A semiconductor device comprising:
a lead frame comprising a plurality of leads;
a routing substrate disposed within the lead frame and comprising a set of first bond pads, a set of second bond pads, and a plurality of interconnections, each interconnection providing an electrical connection between a first bond pad and a corresponding second bond pad;
an active component mounted on the routing substrate and having a plurality of die pads;
electrical couplings between one or more die pads of the active component and corresponding first bond pads of the routing substrate; and
electrical couplings between one or more leads of the lead frame and corresponding second bond pads of the routing substrate.

2. The semiconductor device of claim 1, wherein:
the arrangement of the first bond pads is dependent on the arrangement of the die pads on the active component and independent of the arrangement of the leads on the lead frame; and
the arrangement of the second bond pads is dependent on the arrangement of the leads on the lead frame and independent of the arrangement of the die pads on the active component.

3. The semiconductor device of claim 2, wherein:
the arrangement of the first bond pads being dependent on the arrangement of the die pads on the active component means that a pattern defined by the first bond pads is similar to a pattern defined by the die pads on the active component;
the arrangement of the first bond pads being independent of the arrangement of the leads on the lead frame means that a pattern defined by the first bond pads is dissimilar from a pattern defined by the arrangement of the leads on the lead frame;
the arrangement of the second bond pads being dependent on the arrangement of the leads on the lead frame means that a pattern defined by the second bond pads is similar to a pattern defined by the arrangement of the leads on the lead frame; and
the arrangement of the second bond pads being independent of the arrangement of the die pads on the active component means that a pattern defined by the second bond pads is dissimilar from a pattern defined by the die pads on the active component.

4. The semiconductor device of claim 1, wherein:
the die pads on the active component are arranged in two parallel rows along opposing edges of the active component;
the lead frame is a square lead frame having four sides, with the leads of the lead frame arranged in four rows, each row disposed along one of the four sides of the lead frame;

the second bond pads are arranged in a square formation; and the first bond pads are arranged in two parallel rows, within the square formed by the second bond pads.

5. The semiconductor device of claim 1, wherein:

the set of first bond pads is an inner set of bond pads; and the set of second bond pads is an outer set of bond pads.

6. The semiconductor device of claim 5, wherein:

the set of second bond pads defines a polyhedron within which all of the bond pads in the set of first bond pads are disposed.

7. The semiconductor device of claim 1, wherein:

the average distance between bond pads in the set of first bond pads is less than the average distance between bond pads in the set of second bond pads.

8. The semiconductor device of claim 1, wherein:

the set of first bond pads comprises two or more subsets of similarly-spaced first bond pads; and the set of second bond pads comprises two or more subsets of similarly-spaced second bond pads.

9. The semiconductor device of claim 1, wherein:

the bond pads on the routing substrate are spaced so as to avoid interference between nearby or adjacent electrical couplings.

10. The semiconductor device of claim 1, wherein the lead frame is a quad flat no lead (QFN) lead frame.

11. The semiconductor device of claim 1, wherein the routing substrate has an exposed die pad formed within a portion thereof.

12. The semiconductor device of claim 11, wherein the exposed die pad is formed centrally within the routing substrate.

13. The semiconductor device of claim 1, wherein the active component is an integrated circuit die.

14. A method for assembling a semiconductor device, the method comprising:

(a) mounting, on a routing substrate, an active component having a plurality of die pads, wherein the routing substrate comprises a set of first bond pads, a set of second bond pads, and a plurality of interconnections, each interconnection providing an electrical connection between a first bond pad and a corresponding second bond pad;

(b) disposing the active component and routing substrate within a lead frame comprising a plurality of leads;

(c) electrically coupling one or more die pads of the active component to corresponding first bond pads of the routing substrate; and (d) electrically coupling one or more leads of the lead frame to corresponding second bond pads of the routing substrate.

15. The method of claim 14, wherein:

the arrangement of the first bond pads is dependent on the arrangement of the die pads on the active component and independent of the arrangement of the leads on the lead frame; and the arrangement of the second bond pads is dependent on the arrangement of the leads on the lead frame and independent of the arrangement of the die pads on the active component.

16. The method of claim 15, wherein:

the arrangement of the first bond pads being dependent on the arrangement of the die pads on the active component means that a pattern defined by the first bond pads is similar to a pattern defined by the die pads on the active component;

the arrangement of the first bond pads being independent of the arrangement of the leads on the lead frame means that a pattern defined by the first bond pads is dissimilar from a pattern defined by the arrangement of the leads on the lead frame;

the arrangement of the second bond pads being dependent on the arrangement of the leads on the lead frame means that a pattern defined by the second bond pads is similar to a pattern defined by the arrangement of the leads on the lead frame; and the arrangement of the second bond pads being independent of the arrangement of the die pads on the active component means that a pattern defined by the second bond pads is dissimilar from a pattern defined by the die pads on the active component.

17. The method of claim 14, wherein:

the set of first bond pads is an inner set of bond pads;

the set of second bond pads is an outer set of bond pads; and the set of second bond pads defines a polyhedron within which all of the bond pads in the set of first bond pads are disposed.

18. The method of claim 14, wherein:

the average distance between bond pads in the set of first bond pads is less than the average distance between bond pads in the set of second bond pads.

19. The method of claim 14, wherein:

the set of first bond pads comprises two or more subsets of similarly-spaced first bond pads; and the set of second bond pads comprises two or more subsets of similarly-spaced second bond pads.

20. The method of claim 14, wherein the bond pads on the routing substrate are spaced to avoid interference between nearby or adjacent electrical couplings.

* * * * *